United States Patent
Huddleston et al.

[19]

[11] Patent Number: 5,834,320
[45] Date of Patent: Nov. 10, 1998

[54] METHOD OF ASSEMBLING A SEMICONDUCTOR DEVICE USING A MAGNET

[75] Inventors: Wyatt A. Huddleston, Phoenix, Ariz.; Andrew Szewczyk, Canyon Lake, Tex.

[73] Assignee: Motorola, Inc., Schaumburg, Ill.

[21] Appl. No.: 935,976

[22] Filed: Sep. 23, 1997

Related U.S. Application Data

[63] Continuation of Ser. No. 463,113, Jun. 5, 1995, abandoned.

[51] Int. Cl.$^6$ .......................... H01L 21/52; H01L 21/56; H01L 21/603
[52] U.S. Cl. .............................. 438/3; 438/119; 438/123; 438/760
[58] Field of Search .................................. 437/212, 213, 437/216, 217, 220; 438/3, 373, 383, 119, 123, 760

[56] References Cited

U.S. PATENT DOCUMENTS

| | | | |
|---|---|---|---|
| 3,855,693 | 12/1974 | Umbaugh | 228/4 |
| 3,868,759 | 3/1975 | Hartleroad et al. | |
| 3,868,764 | 3/1975 | Hartleroad et al. | |
| 3,887,998 | 6/1975 | Hartleroad et al. | |
| 3,918,146 | 11/1975 | Hartleroad et al. | |
| 3,941,297 | 3/1976 | Burns et al. | 228/4.1 |
| 3,960,279 | 6/1976 | Hartleroad et al. | |
| 4,586,375 | 5/1986 | Manfredi | 73/432 |
| 4,759,675 | 7/1988 | Bond et al. | 414/222 |
| 4,769,344 | 9/1988 | Sakai et al. | 437/216 |
| 5,247,248 | 9/1993 | Fukunaga | 324/158 F |
| 5,399,518 | 3/1995 | Tran et al. | 29/872 |
| 5,477,886 | 12/1995 | Rai | 437/183 |
| 5,479,694 | 1/1996 | Baldwin | 29/593 |

Primary Examiner—David Graybill
Attorney, Agent, or Firm—Patricia S. Goddard; J. Gustav Larson

[57] ABSTRACT

Process for maintaining lead positions within a glass layer of a CQFP semiconductor device by using a magnet during high temperature assembly operations. During lead embed, a magnet (46) is magnetically attached to lead frame (44). Upon reflow of a glass layer (48), leads (50) sink into the glass layer to a height controlled by the height (H) of a protrusion (52) of the magnet. A similar magnet (62) can be used to maintain the lead positions during a high temperature operation used to cure a die attach material (60). Yet another magnet (70) can be used to maintain the positions of leads (50) during a lid seal operation. A common magnet design for use in all thermal operations can instead be used. Use of the magnets restrict movement of the leads within the glass layer when the glass is in a softened state.

22 Claims, 4 Drawing Sheets

METHOD OF ASSEMBLING A SEMICONDUCTOR DEVICE USING A MAGNET

This application is a continuation of prior patent application Ser. No. 08/463,113 filed Jun. 5, 1995 abandoned.

FIELD OF THE INVENTION

The present invention relates to semiconductor devices in general and more specifically to methods for assembling semiconductor devices.

BACKGROUND OF THE INVENTION

Figure 1:
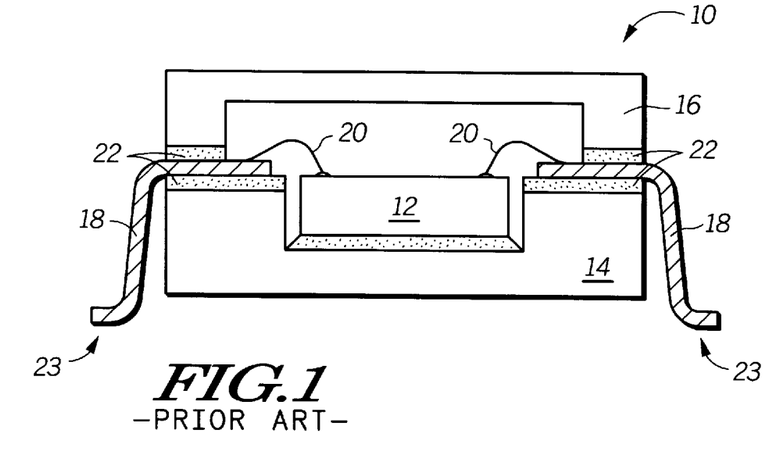
FIG. 1 is a cross-sectional illustration of a CQFP package in accordance with a prior art embodiment and taken from a side view.

A ceramic quad flat package (CQFP) is a lower cost alternative to conventional pin grid array (PGA) packages used for high performance semiconductors. A cross-sectional side-view illustration of a conventional CQFP package is illustrated in FIG. 1. A semiconductor device 10 includes a semiconductor die 12 which is enclosed within a package made up of a package base 14 and a package lid 16. A plurality of leads 18 is positioned between the package base and lid. Bond pads (not visible in FIG. 1) on the top surface of die 12 are coupled to individual leads by wire bonds 20. Leads 18 are held between the package base and lid by a glass material 22. A conventional assembly process for making semiconductor device 10 is as follows. Package base 14 is provided having a glass layer predisposed on a top surface of the base. The bulk material of the base is typically a ceramic. A lead frame is then positioned on the glass layer of the package base. The base and lead frame are then subjected to a high temperature operation sufficient to soften or reflow the glass layer. Upon softening the glass, the weight of the lead frame forces the individual leads into the glass layer. Upon cooling, the glass solidifies causing the leads to be partially embedded into the glass layer. Following a conventional die attach and wire bonding operation, package lid 16, also usually being a ceramic, is attached in a similar fashion. The lid is provided with a predisposed glass layer around the parameter of the lid. The lid is then placed in contact with the leads already embedded in the glass layer on the package base and over the package base. The entire assembly then undergoes an additional high temperature process to soften or reflow the glass layer on the lid. Upon softening the glass, the weight of the lid against the lead frame and package base causes the glass layer to be displaced around the leads. (Alternatively, the entire assembly can be inverted from the orientation illustrated in FIG. 1, in which case the weight of the package base and lead frame are forced against the package lid to produce the same result.) Upon cooling, the leads are then embedded between both the glass layer from the base and the glass layer from the lid. Excessive portions of the lead frame are then excised in the individual leads are trimmed and formed into the desired final configuration. The result of these processes is a packaged device such as that illustrated in FIG. 1.

Figure 2:
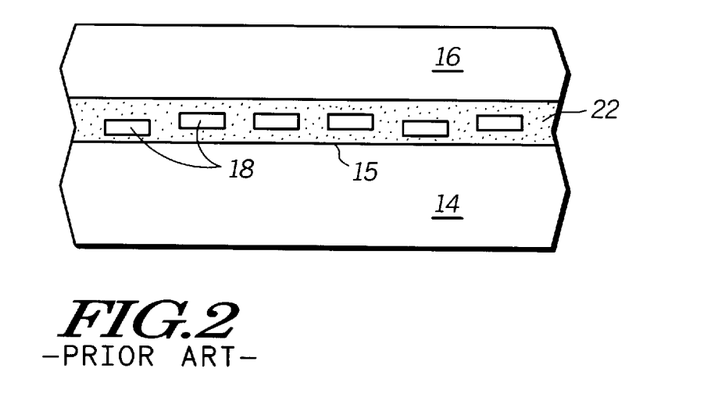
FIG. 2 is a side-view cross-section of a portion of the package illustrated in FIG. 1 and taken near the edge of the package base and lid.

While conventional CQFP packages are attractive as a low cost alternative to PGA packages, the assembly process used to form these packages has some drawbacks. The most significant of these is the displacement of leads 18 within the glass layers. FIG. 2 illustrates a vertical displacement problem with the leads. FIG. 2 is a portion of a cross-section of the package illustrated in FIG. 1 as taken from a side view near the edge of the package (i.e. not through the cavities of the base and lid). Cross-sectional areas of leads 18 are illustrated in FIG. 2. As shown, it is apparent that the positions of leads 18 vary relative to an uppermost surface 15 of package base 14. In other words, the height of leads 18 within glass material 22 is not uniform throughout the package. Non-uniform embedded lead heights pose several problems.

One problem with non-uniform embedded lead heights arises in the wire bonding process. Because the leads are located at different heights, a wire bonding operation has to accommodate for the variation. One method for accommodating varying lead heights is to program the wire bonding tool to make wire bonds having higher loop heights than would otherwise be required. Higher loop heights are required in order to wire bond to those leads which are embedded highest within the glass material 22 while at the same time preventing sagging of the wire bonds. Having to use wire bond loop heights which are larger than would otherwise be required is disfavored because it forces the overall height of the package to be larger and because higher loop heights in general require more processing time.

Another problem with having varying lead heights within glass material 22 relates to final lead co-planarity. After the leads have been embedded within glass material 22 and between package base 14 and package lid 16, the leads are excised from other portions of the lead frame, and are trimmed and formed into a final configuration, such as a gull-wing configuration illustrated in FIG. 1. Because the leads have varying heights within glass material 22, the leads will likewise exit the package in different horizontal planes between the lid and the base. During a trim and form operation, the plurality of leads are clamped and forced into a common horizontal plane. The leads are then formed into the configuration desired, and the clamp is released. Although the leads existed within a common plane upon clamping and forming, upon releasing the clamp the leads revert to their original vertically displaced positions. The result is that the final formed leads are also vertically mispositioned to the extent of their vertical displacement in glass material 22. In other words, external tips 23 of leads 18 are not co-planar. Co-planarity is essential for a device user who wants to mount the device to a printed circuit board.

Figure 3:
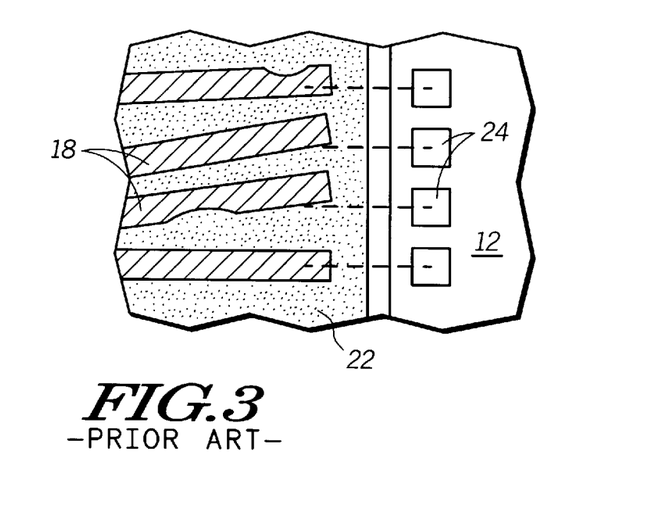
FIG. 3 is a top view of a portion of the package illustrated in FIG. 1 in the absence of the package lid.

Another type of lead displacement problem, specifically a lateral lead displacement, is illustrated in FIG. 3. FIG. 3 shows a portion of semiconductor device 10 from a top view prior to lid 16 being attached to the base. As illustrated, leads 18 are on glass material 22. Semiconductor die 12 includes a plurality of bond pads 24 which need to be electrically coupled to leads 18 to provide functionality to the device. One method for electrically coupling the leads to the die is by wire bonds. Preferred wire bond positions are illustrated in FIG. 3 in phantom. However, as shown, not all of the leads are correctly positioned for receiving the preferred wire bond orientation. Some of the leads are laterally skewed with respect to their desired positions. A solution to the problem of laterally skewed leads is to use a wire bonding process which uses a vision system to locate leads (sometimes referred to as video lead locating —VLL— capability). VLL can generally accurately find a lead and change the wire bond orientation according to any displacement observed in the lead position. But a significant disadvantage of using VLL is throughput. Typically, the use of VLL can add five to fifteen seconds per package to the wire bonding process.

FIG. 3 also illustrates yet another problem associated with conventional CQFP assembly, namely the problem of having glass on the leads. During the lead embed process, wherein the leads are embedded into the glass material on only the package base, it is important for the upper surface of the leads to remain uncovered by any glass. If glass reflows onto the top surface of the leads, particularly near the enter lead tips, the wire bonds will not properly adhere to the leads.

From the forgoing, it is apparent that current CQFP manufacturing processes encounter several problems associated with lead positioning within the glass material. Accordingly, there is a need for an improved process which alleviates the foregoing problems and improves the manufacturability of CQFP packages.

DETAILED DESCRIPTION OF A PREFERRED EMBODIMENT

Generally, the present invention is a method for maintaining accurate lead positions within a glass or other reflowable material layer of a package. The inventive methods employ a high temperature magnet which is brought into contact with the leads and lead frame during high temperature assembly operations. High temperature assembly operations, for example those achieving temperatures in excess of 350° C., can occur at several stages during assembly, including a lead embed operation, a die attach operation, and a lid seal operation. During each of these operations, the device is subjected to temperatures which cause a pre-formed glass layer on the package base or lid to soften or reflow. In prior art processes, when the glass is in a softened state, the leads are able to freely move within the glass. Upon cooling, the leads become fixed in whatever position they moved to during the softened glass state. Unrestricted lead movement when the glass is in its softened state can result in leads being both vertically and horizontally displaced from their intended positions as a result of having to relieve stress build up caused by high temperature exposure. Lead displacement then causes subsequent assembling problems during the wire bonding operation and during the trim and form operation, as discussed previously in the background.

The present invention resolves these lead misalignment problems by utilizing a magnet during high temperature operations to restrict movement of the leads to controlled positions within the glass layer. The magnet is capable of retaining magnetism during, and in general physically withstanding, the high temperatures involved in the thermal processing, while the lead frame material is one which is capable of being magnetized by the magnet. Because the leads and lead frame are held against the magnet during thermal operations, lead movement is restricted and displacement within the softened glass does not occur. The physical configuration of the magnet can be designed specifically for each of the high temperature operations involved in the assembly process. Further, the magnet configuration can be designed to guarantee specific embedded lead heights according to a manufacturer's specifications. Alternatively, a general, more simplified magnet configuration can be chosen to be suitable for use in all operations rather than having operation specific magnet designs. Because lead positions are accurately controlled and maintained in practicing the present invention, manufacturing yields in subsequent assembly operations are significantly increased.

These and other features and advantages of the present invention will be more clearly understood from the following detailed description taken in conjunction with the accompanying drawings. It is important to point out that the illustrations are not necessarily drawn to scale and that there can be other embodiments of the present invention which are not specifically illustrated. Throughout this description and in the figures, like reference numerals are sometimes used to designate an identical or corresponding elements.

Figure 4:
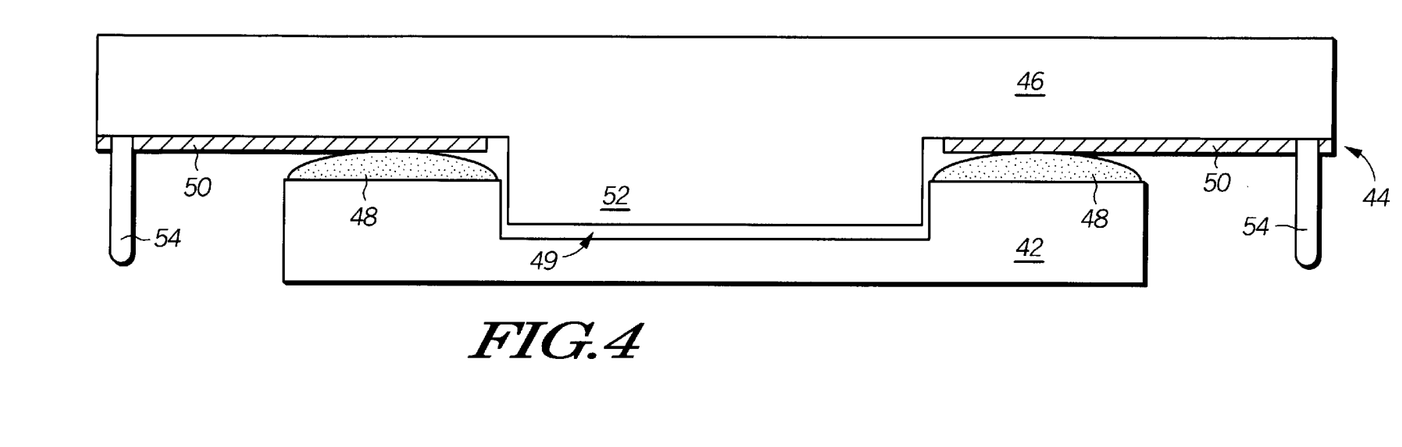
FIGS. 4 and 5 illustrate, in cross-sectional side-views, a method for embedding leads to a package base in accordance with the present invention.
Figure 5:
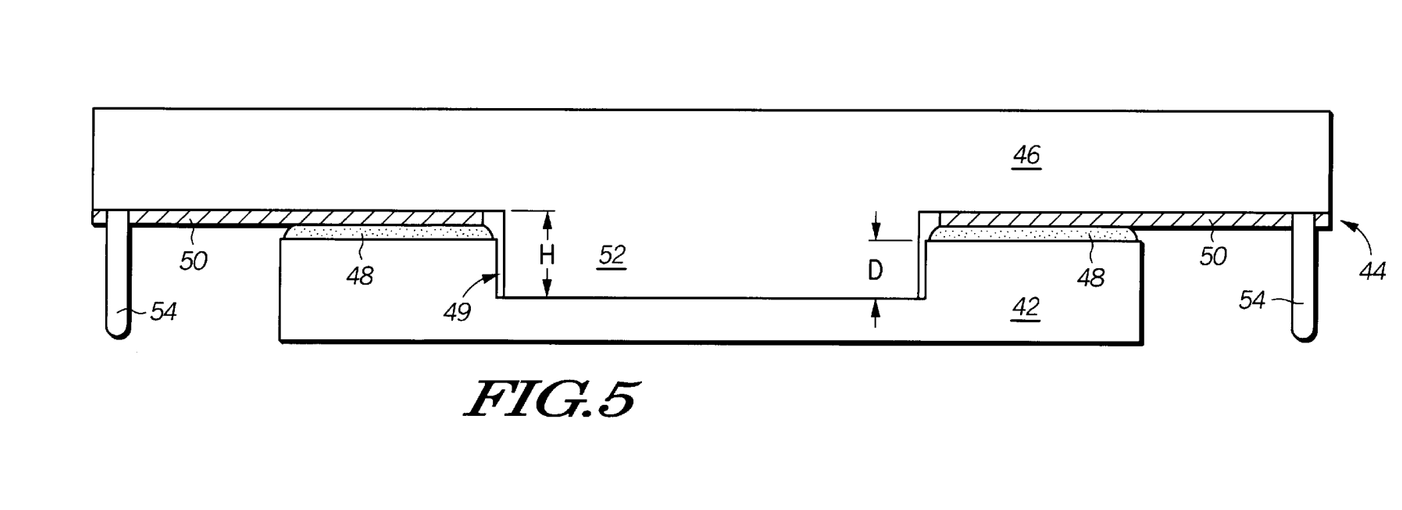
Figure 6:
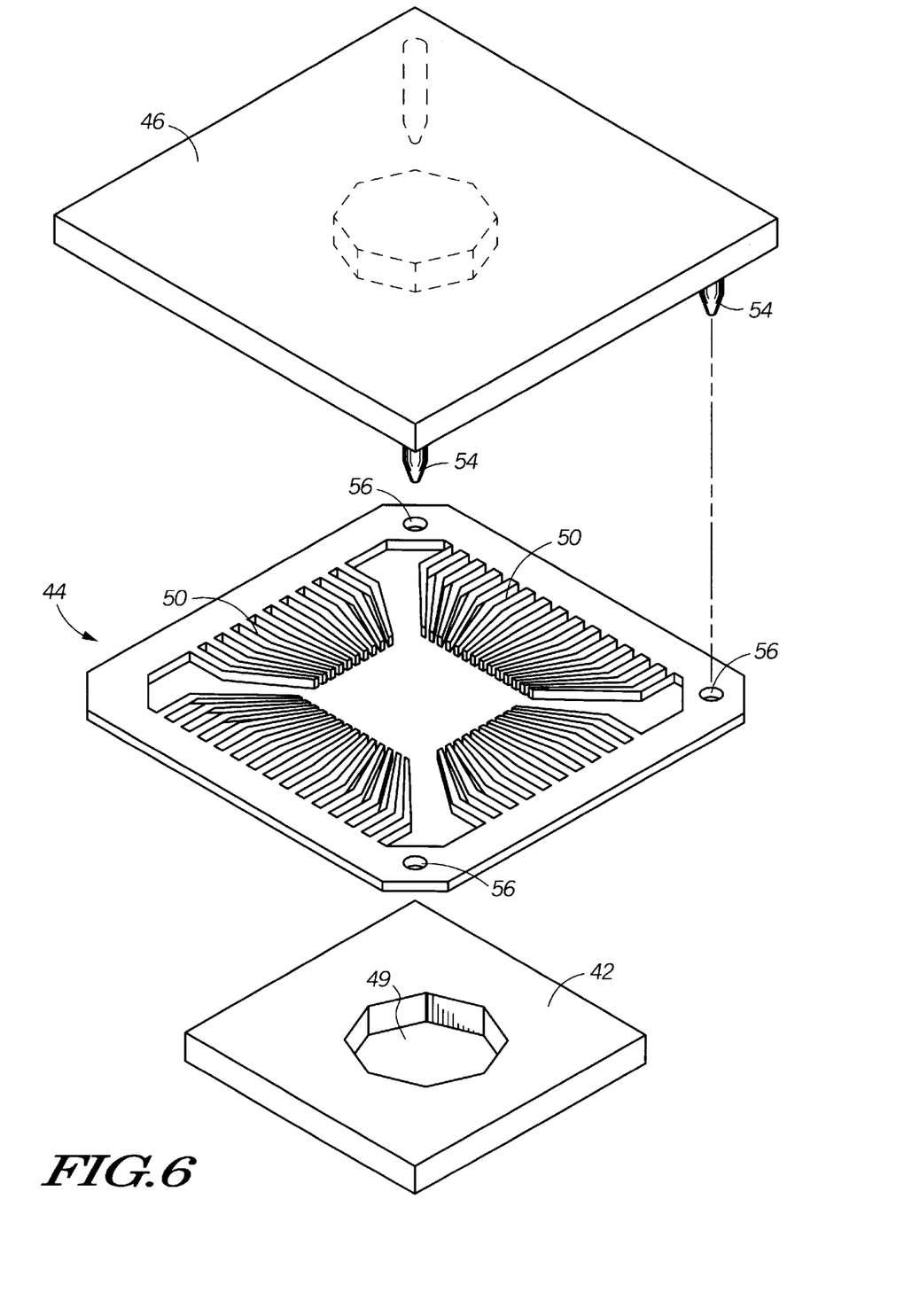
FIG. 6 is a perspective view of how a package base, a lead frame, and a magnet cooperate during the method illustrated and described in reference to FIGS. 4 and 5.

FIGS. 4 and 5 illustrate, in cross-sectional side views, a method in accordance with the present invention for connecting leads of a lead frame to a package base using a magnet. FIG. 6 is a perspective view of the three major components used in the method, specifically a package base 42, a lead frame 44, and a magnet 46. FIG. 6 also demonstrates how these components cooperate with one another in the process illustrated in FIGS. 4 and 5.

As illustrated in FIG. 4, a package base 42 is provided having a glass layer 48 predisposed on an upper surface of the package base. While glass is a preferred material for layer 48, other electrically insulating and reflowable materials can be suitable for practicing the invention. For example, epoxy or low dielectric polymers can be used in place of glass. In many instances, glass layer 48 is formed on package base 42 by the package manufacturer, rather than by the semiconductor manufacturer. However, the glass layer can be applied by the semiconductor manufacturer as part of the assembly process. In a preferred form, package base 42 is a ceramic (such as alumina), although other materials, including metals, can be used to form the base. As illustrated, base 42 includes a cavity 49 for receiving a semiconductor die, as explained further below. Lead frame 44 is positioned over the top surface of package base 42. Lead frame 44 has a plurality of leads 50, which will surround cavity 49 upon assembly. For purposes of practicing the invention, lead frame 44 is made from a material which is capable of being magnetized by magnet 46. In a preferred form, lead frame 44 is formed from an alloy of iron and nickel, such as that commonly referred to as Alloy 42. Cobalt can also be included as a constituent of any lead frame used. As illustrated in FIG. 4, lead frame 44 is positioned on package base 42 such that the leads 50 rest upon glass layer 48. In order to insure proper alignment of lead frame 44 with respect to the package base, trays or boats (not shown) used to handle the package bases can be equipped with alignment mechanisms in accordance with conventional practice.

After having lead frame 44 properly positioned on package base 42, magnet 46 is brought into contact with lead frame 44 as illustrated in FIG. 4. It should be noted that it is not necessary for the lead frame and magnet to be positioned separately over package base 42. Instead, the lead frame can be pre-attached to the magnet, and together the magnet and lead frame can be positioned over the base. The surface of magnet 46 which contacts leads 50 is planar so that it may maintain the position of leads 50 in a single plane during thermal operations.

Upon positioning magnet 46 and lead frame 44 on package base 42 (either separately to as a combination), the entire assembly undergoes a thermal process sufficient to soften the glass. As a result of glass softening, the leads will sink to a depth within the glass due to gravitational forces and the inherent weight of lead frame 44 and magnet 46. Additional external pressure may be applied to hasten the sinking process.

Conventional glasses can be used in accordance with practicing the present invention. Typical glass materials used on package bases and lids for CQFP packages consist of lead borate as the matrix glass combined with various ceramic fillers provided for additional strength and low thermal expansion. Lead borate glasses, in addition to yttrium and thallium glasses, are suitable for practicing the present invention. One particular sealing glass used by the electronics industry and suitable for practicing the present invention is manufactured by Nippon Electric Glass Company and is identified by its glass code number, LS2001B. The manufacturer of this glass cites that the material has a recommended sealing, or reflow, temperature of 430° C. for the application of package sealing or embedding lead frames onto glass-bearing bases. At the reflow temperature, glass layer 48 softens and is unable to support the weight of lead frame 44 and magnet 46. Accordingly, the magnet and lead frame sink into the glass layer, as illustrated in FIG. 5. To control the depth at which leads 50 are embedded into glass layer 48, a protrusion 52 can be designed into magnet 46 to have a controlled height ('H'). The height of the protrusion is set to equal a depth of cavity 49 ('D') plus the desired distance between the upper most surface of leads 50 and the upper surface of package base 42. Instead of including protrusion 52, optimization of the magnet weight, the lead frame weight, the material used for glass layer 48, and the time and temperature profile of the thermal operation can be optimized to control the lead height. The desired height of leads 50 relative to the upper surface of package base 42 for a given package will vary depending upon variations in height of glass predisposed onto the base as well as variations in depth of the base cavity. As a general rule, the upper exposed surface of the leads should be at least co-planar with the upper surface of the die (which will eventually be mounted within cavity 49 of the package base), and can be up to about 15 mils (0.375 millimeters) above the upper die surface. Accommodation should be made for the thickness of the die attach material used for mounting the die.

For purposes for practicing the invention, magnet 46 needs to be able to withstand high temperature processing. One magnetic material found suitable for typical assembly thermal operations is a alloy of aluminum, nickel, and cobalt. More specifically, aluminum-nickel-cobalt alloy magnets sold by Magnet Sales and Manufacturing Company of Culver City, Calif., under the names of "Alnico 2", "Alnico 5", and "Alnico 8" (each having a recommended practical operating temperature of 540° C.) are suitable for practicing the present invention. Many high temperature magnetic materials are likely to be suitable for practicing the invention as well; however, only the aluminum-nickel-cobalt alloys were tested by the inventors. Another characteristic of magnet 46 which might influence the selection of a magnet material is the ability to maintain a sufficient holding force. The holding force of a magnet is related to the square of the residual flux density, $B_r$, so possessing as high a $B_r$ is desirable. Possessing a low temperature loss coefficient, as measured by the percent loss of magnetic flux per increase in temperature, is also important to ensure adequate holding force at high temperature.

As mentioned previously, magnet 46 can include a protrusion 52 which fits within cavity 49 of the package base to control the lead embed height. Magnet 46 can also optionally include alignment pins 54 which are received by alignment holes 56 of lead frame 44 to accurately position the magnet with respect to the lead frame and package base. Alignment features other then pins (for instance, corner legs which embrace a corner of package base 42) can be used if needed or desired.

As can be understood in reference to FIG. 5, leads 50 are restrained from free movement by magnet 46 during the thermal processing used to soften glass layer 48. Accordingly, upon cooling the assembly, leads 50 are embedded within the glass layer in their designed positions, rather than in displaced positions which can result from unrestrained lead movement during thermal processing. However, even after the lead embed process, the assembly is likely to undergo additional high temperature operations. If the leads remain unrestrained during the subsequent high temperature operations, the benefit of using a magnet during the lead embed process may not be fully realized. Accordingly, the present invention also includes methods for using a magnet in other high temperature operations. Specifically, FIG. 7 and FIG. 8 illustrate methods in which the present invention utilizes a magnet during a die attach operation and a lid seal operation, respectively.

Figure 7:
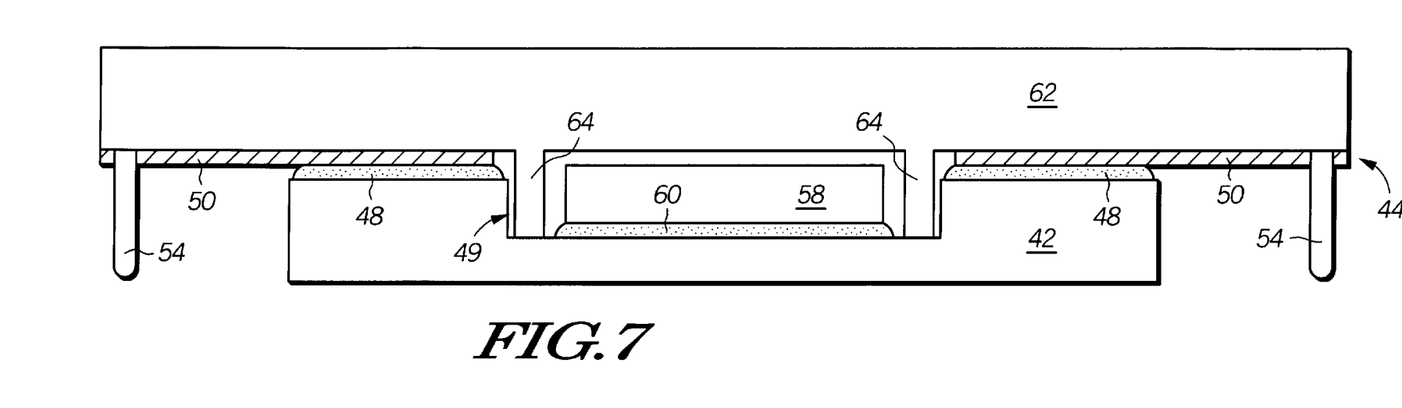
FIG. 7 illustrates in cross-section an embodiment of the present invention wherein a magnet is used following attachment of a semiconductor die to a package base.

As illustrated in FIG. 7, leads 50 are embedded into glass layer 48 of package base 42 as previously described. After embedding the leads, a next operation is to mount or attach a semiconductor die 58 within cavity 49 of the package base. In a preferred embodiment, die 58 is attached to package base 42 using a conventional glass die attach material 60, which can be loaded with conductive particles such as silver for purposes of electrically grounding the semiconductor die. Silver filled glass die attach materials also typically include solvents. After attaching the die to the package base using the die attach material, the solvents must be driven off. This is accomplished again with a high temperature thermal operation, for example an operation which involves a temperature in excess of 350° C. During the high temperature cure of the die attach material, glass layer 48 will also be heated and may soften, in which case there is a risk that leads 50 will shift position to relieve temperature induced stresses. To prevent such lead shifting, a magnet 62 is utilized in accordance with the present invention during the die attach cure operation. Magnet 62 is composed of the same materials as those described in reference to magnet 46. The physical configuration of magnet 62 is slightly different. Due to the presence of semiconductor die 58, protrusion 52 of magnet 46 cannot be used as previously illustrated. Instead, magnet 62 can be provided with stand offs 64 which serve the same purpose as protrusion 52. Stand offs 64 may form one continuous ring around semiconductor die 58, or may be individual stand offs placed within only a few locations within cavity 49. Stand offs 64 are an optional feature designed to guarantee a particular embedded lead height. However, optimization of the magnet weight, the lead frame weight, the material used for glass layer 48, and the time and temperature profile of the thermal operation can be optimized to control the lead height without inclusion of members such as stand offs 64. By eliminating the stand offs, magnet 62 can be made much more cheaply, since intricate machining for forming the features is not necessary. Without stand offs, magnet 62 can be provided having completely planar upper and lower surfaces. An advantage in using a simple, planar configuration is that the same magnet design is able to be used in multiple thermal operations. Alignment pins 54 can also be included in magnet 62 to assure proper positioning of the magnet relative to the package base and lead frame. Alignment pins 54 may be a separate element attached to magnet 46 or 62, rather than being fabricated of the same material as the magnet to further reduce the piece-part cost of the magnet.

Figure 8:
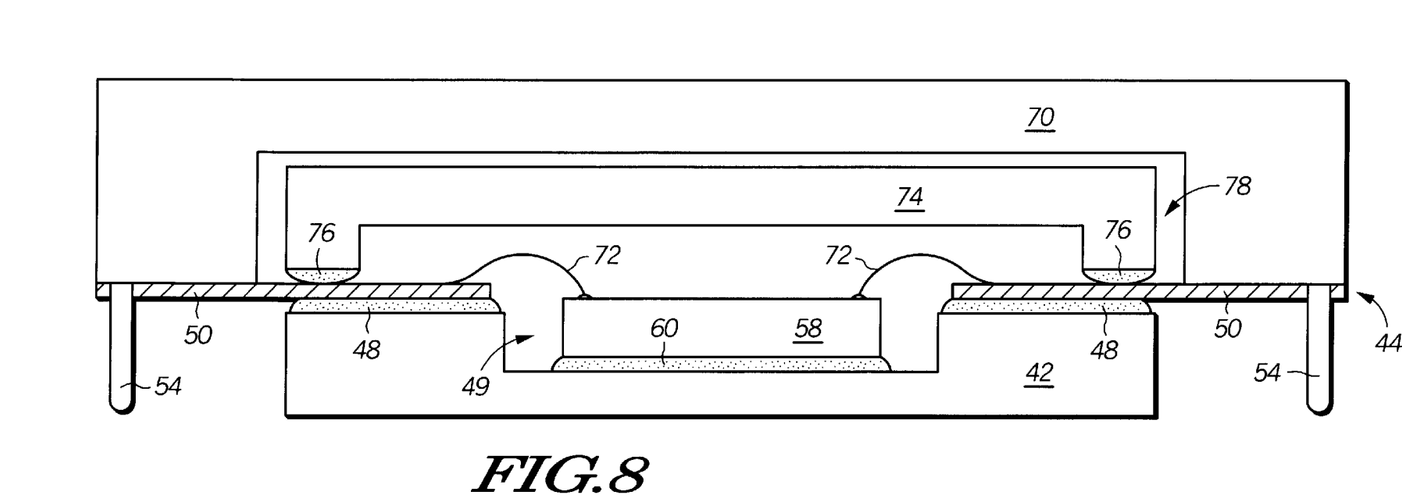
FIG. 8 illustrates in cross-section an embodiment of the present invention wherein a magnet is used during attachment of a lid to the packaged base.

As illustrated in FIG. 8, a magnet 70 is utilized during a lid seal operation in accordance with the present invention. After the semiconductor die 58 is attached or mounted to package base 42, bond pads of die 58 are electrically coupled to respective leads 50 of the lead frame by a plurality of wire bonds 72. The wire bond operation is performed in accordance with conventional practices; however, because the position of leads 50 is so accurately controlled in practicing the present invention the wire bonding process has significantly higher yields and faster throughput. After the wire bonding operation, a package lid 74 is attached to the package base, thereby enclosing and hermetically sealing semiconductor die 58 between the package lid and base. Lid 74 is also formed of a ceramic material, and the seal is effected by softening or reflowing a glass layer 76 which is formed around a periphery of the lid. Lid 74 is positioned over package base 42 such that glass layer 76 is in contact with leads 50, and between adjacent leads 50 in contact with glass layer 48. To effect this seal, the lid, base, and lead frame undergo a high temperature operation to soften or reflow glass layer 76. (Note that as illustrated in FIG. 8, glass layer 76 has not yet been reflowed). During the high temperature reflow operation, glass layer 48 (most likely being of the same material as glass layer 76) will likewise soften or reflow. The combined weights of the lid, lead frame, base, and magnet cause both glass layers to disperse the glass between the leads, embedding the leads from both the top and bottom. Because the glass layers are softened during the lid seal operation, if leads 50 are not properly restrained, there is the potential for any benefit in previously using a magnet to restrict the movement of the leads in thermal operations to be lost.

Accordingly, the present invention also provides that magnet 70 can be used during the lid seal operation to similarly restrict movement of the leads, thereby maintaining the benefit of accurate lead positions throughout the entire assembly process. Magnet 70 is likewise formed of similar materials to those of magnets 46 and 62. The configuration of magnet 70 is such that it is able to be attached to lead frame 44, or more specifically to portions of leads 50 which extend beyond the perimeter of lid 74 and package base 42, while also accommodating for lid 74. As illustrated in FIG. 8, such a configuration is achieved by providing a cavity 78 within magnet 70. In positioning magnet 70 over the assembly, lid 74 fits within cavity 78 of the magnet, such that the magnet is able to make contact to extending portions of leads 50. As illustrated, there is a space or gap between magnet 70 and lid 74, however, this is not a requirement of the magnet configuration. Nor is it a requirement that magnet 70 fully enclose the lid. For example, the magnet can instead be configured into a planar ring configuration having an opening which accommodates lid 74, rather than a cavity which accommodates the lid. A ring configuration for the magnet will also permit that same magnet configuration to be used in multiple thermal assembly operations. Furthermore, it is also possible for magnet 70 to address the lead frame from beneath package base 42, rather than from above as illustrated in FIG. 8.

While much of the foregoing description suggests that the present invention is only applicable to operations involving temperatures in excess of a material's reflow temperature, it is important to note that a variety of other factors influence reflow characteristics and the ability to embed leads in glass. This is especially important since in many instances a precise reflow temperature cannot be defined. The lead embed depth or height in the glass can be controlled to a pre-determined value as a result of empirically characterizing the time and temperature relationship during process definition. In general, the longer the time and the higher the temperature, the deeper leads will be embedded into the glass. As compared to a conventional lead embed time-temperature relationship, the application of added weight to the lead frame by employing a magnet during the lead embed process will change (reduce) one of these variables (either temperature or time) when the other is held constant to get the same lead embed depth. Thus, the present invention has the benefit of permitting faster assembly operations performed at lower temperatures. For instance, at 400° C., it was found that leads embedded while being coupled to a magnet could be adequately embedded into glass in a few minutes. Without the weight of the magnet, it may require well over an hour to achieve the same embed depth at 400° C. relying upon the weight of the lead frame alone. Naturally, the actual weight of the magnet will affect the time necessary for lead embedding at any temperature. An advantage of lowering the process temperature for sealing operations is that lower temperature die attach materials (e.g. polyimides) can perhaps be used in place of the more traditional glass die attach materials.

In practicing the present invention, dramatic improvements in vertical and lateral lead position control were observed. Conventionally embedded leads (without use of a magnet) were profiled by a surface profilometer and found to have up to 0.08 millimeter (mm) height variation across a 100 $mm^2$ section of the embedded lead frame. Lead frame embedding into glass in accordance with the present invention, using an Alnico 8 aluminum-nickle-cobalt alloy magnet ground to a specified surface flatness of 0.01 mm, was performed on the same package type. A surface profile of the leads embedded with the Alnico 8 aluminum-nickle-cobalt alloy magnet, as measured in the same 100 $mm^2$ area, showed a variation in embedded lead height of only within 0.01 mm. This demonstrates that the inventive process is capable of reducing lead height variations to the level of flatness of the magnet used in the lead frame embed operation, which is a remarkable improvement over the prior art.

The foregoing description and illustrations contained herein demonstrate many of the advantages associated with the present invention. In particular, it has been revealed that use of a magnet during assembly operations greatly enhances the ability to control lead positions within a glass layer of a semiconductor package. The benefit of controlled lead positions solves many problems associated with past assembly processes. For example, tightly controlled lead positions can eliminate the use of a VLL program on a wire bonding tool, thereby reducing throughput by between five and fifteen seconds per package. Another problem eliminated by having well controlled lead positions is the defect of glass on the leads. Having glass on the leads can lead to unreliable wire bonding. A further benefit of having well controlled lead positions is that the loop height of wire bonds can be reduced since the wire bonds no longer have to accommodate for varying lead heights within the glass. Furthermore, tightly controlled lead positions within the glass improve external lead co-planarity once the leads are trimmed and formed. An additional benefit of practicing the present invention is that the high temperature process used to embed leads to the glass layer can be performed at a lower temperature and more quickly as compared to processes which do not employ a magnet.

The present invention can also be used in conjunction with creating multiple layers of leads in a semiconductor package. With increased performance and complexity of semiconductor devices comes increased numbers of input and output terminals. To accommodate an increase in the number of bond pads on a die while also minimizing the size of the final packaged device, some manufacturers employ multi-layer lead frames or packages with multiple layers of leads. The present invention can be used to make a multi-tiered or multi-layer CQFP, or other package. For example, after embedding a first plurality of leads into a glass layer on a base (as described in reference to FIGS. 4 and 5), an additional glass or other reflowable dielectric material can be screened onto the embedded leads. A second plurality of leads can then be embedded into this layer in a similar fashion, preferably with the second plurality of leads inter-digitated with the first plurality of leads. Two magnets (one from the bottom for the first lead frame and one from the top for the second lead frame) can be used to optimize and control positions of all leads during subsequent high temperature operations. A benefit of using two different lead embed operations is that each lead frame can be fabricated with greater manufacturing tolerances (e.g. wider lead pitches) while the final packaged semiconductor device maintains a finer lead pitch than either of the lead frames. Furthermore, by layering multiple lead frames the lead tips can be brought closer to the die edge and wire bonds can be made shorter and more robust. As yet another alternative, instead of attaching a second plurality of leads above the first plurality of leads, a power or ground plane could be attached above or below the first plurality of leads to enhance device performance.

Thus it is apparent that there has been provided in accordance with the invention, a method for assembling a semiconductor device using a magnet that fully meets the needs and advantages set forth above. Although the invention as been described and illustrated with reference to specific embodiments thereof, it is not intended that the invention be limited to these illustrative embodiments. Those skilled in the art will recognize that modifications and variations can be made without departing from the spirit of the invention. For example, the physical configurations of the magnets herein illustrated are merely representative. Other magnet configurations can be used in practicing the invention provided the magnet is in sufficient magnetic contact with the lead frame to adequately restrict movement of the leads during high temperature operations. Similarly, the physical composition of the magnet is not restricted to those embodiments described. As long as the magnetic material has sufficient magnetic field at the temperatures involved in the thermal processing, the materials should work for the purposes of practicing the present invention. It is also important to note that the present invention need not be practiced at each of the three assembly operations specifically herein described (lead embed, die attach material cure, and lid seal). While it is preferred that a magnet is used in all high temperature operations subsequent to the lead embed operation (and including the lead embed operation), such is not a specific requirement for practicing the present invention. In addition, the present invention is not limited to the specific lead frame and glass or reflowable materials mentioned herein. Any electrically conductive magnetizable material has the potential for the lead frame, and any electrically insulating material which is a solid at room temperature but which softens or reflows at elevated temperatures has the potential for use in the package. Nor it the invention limited to use in assembling CQFP packages. As examples, the invention can be practiced in other lead embedded packages, such as ceramic dual-line-packages (CERDIPs). It is also important to note that a reflow temperature of a material is dependent upon time, temperature, and force applied to the material. Increases in any one of these variables will hasten the reflow process. Accordingly, any given material is likely not to have one precisely defined reflow temperature but instead will have multiple reflow temperatures, depending upon the time the material is subjected to the temperature and the force being applied to the material during that time. For purposes of practicing the present invention, the reflow temperature recited is simply that temperature at which leads can be embedded into the glass or reflowable material, or at which a lid can be sealed, or at which the die attach material can be cured, depending upon which assembly operation is being considered and irrespective of the force applied and duration of the thermal operation. Therefore, it is intended that this invention encompass all such variations and modifications as fall within the scope of the appended claim.

We claim:

1. A method of assembling a semiconductor device comprising the steps of:

providing a base having a reflowable material on a surface thereof, the reflowable material being glass and has a reflow temperature, and the base being a ceramic base;

providing a lead frame capable of being magnetized and having a plurality of leads, wherein the lead frame is positioned on the surface of the base;

placing a magnet on the lead frame;

subjecting the base, the lead frame, and the magnet to a thermal process involving a temperature of at least the reflow temperature of the reflowable material, wherein during the step of subjecting, the magnet restricts movement of the plurality of leads, thereby maintaining accurate positions of the plurality of leads within the reflowable material; and removing the magnet from the lead frame after the step of subjecting.

2. The method of claim 1 wherein the step of providing a lead frame comprises providing a lead frame made of an alloy of iron and nickel.

3. The method of claim 1 wherein the step of placing a magnet comprises placing a magnet comprised of an alloy of aluminum, nickel, and cobalt.

4. The method of claim 1 wherein the step of placing a magnet comprises aligning the magnet to the lead frame using an alignment member incorporated into the magnet.

5. The method of claim 1 wherein the step of subjecting comprises subjecting the base, the lead frame, and the magnet to a temperature of at least 350° C.

6. A method of assembling a semiconductor device comprising the steps of:

providing a package base having a glass layer formed on a surface thereof;

providing a magnetizable lead frame having a plurality of leads;

providing a magnet;

positioning the magnetizable lead frame on the package base such that the plurality of leads is next to the glass layer;

placing the magnet on the magnetizable lead frame; and embedding the plurality of leads into the glass layer by subjecting the package base, the magnetizable lead frame, and the magnet to a thermal operation involving a temperature above a reflow temperature of the glass layer, wherein during the thermal operation the magnet restricts movement of the plurality of leads to control positions of the plurality of leads within the glass layer.

7. The method of claim 6 wherein the step of providing a package base comprises providing a package base having a cavity, and wherein the step of providing a magnet comprises providing a magnet having a protrusion, and wherein the step of placing the magnet comprises placing the magnet on the magnetizable lead frame and over the package base such that the protrusion of the magnet fits within the cavity of package base.

8. The method of claim 7 wherein the step of providing a magnet comprises providing a magnet wherein the protrusion has a stand off height equal to a depth of the cavity plus a desired embedded lead height as measured from the surface of the package base.

9. The method of claim 6 wherein the step of embedding comprises embedding the plurality of leads by softening the glass layer in the thermal operation and relying upon a weight of the magnetizable lead frame and a weight of the magnet to push the plurality of leads into the glass layer upon softening.

10. The method of claim 6 wherein during the step of embedding, the package base, the magnetizable lead frame, and the magnet are subjected to a temperature of at least 350° C.

11. A method of assembling a semiconductor device comprising the steps of:

providing a package base having a die receiving area and a glass layer surrounding the die receiving area, the glass layer having a reflow temperature;

providing a lead frame capable of being magnetized and having a plurality of leads;

providing a semiconductor die;

providing a magnet;

embedding the plurality of leads into the glass layer of the package base;

attaching the semiconductor die to the die receiving area of the package base using a die attach material; and curing the die attach material by subjecting the package base, the lead frame, and the semiconductor die to a thermal process involving a temperature in excess of the reflow temperature of the glass layer;

wherein during the step of curing, the magnet is brought into contact with the lead frame to maintain positions of the plurality of leads during the thermal process.

12. The method of claim 11 wherein the step of attaching comprises attaching the semiconductor die using a silver-filled die attach material.

13. The method of claim 11 wherein the step of embedding comprises using a magnet to maintain positions of the plurality of leads during the step of embedding.

14. The method of claim 11 wherein the step of providing a magnet comprises providing a magnet which includes a cavity, and wherein the semiconductor die fits within the cavity when the magnet is brought into contact with the lead frame.

15. The method of claim 11 wherein during the step of curing, the package base, the lead frame, and the semiconductor die are subjected to a temperature of at least 350° C.

16. A method of assembling a semiconductor device comprising the steps of:

providing a package base having a periphery, a die receiving area, a semiconductor die mounted in the die receiving area, and a lead frame having a plurality of leads positioned around the semiconductor die, wherein a portion of each lead of the plurality of leads extends beyond the periphery of the package base;

providing a lid having a periphery and a glass layer at least around the periphery of the lid, the glass layer having a reflow temperature;

placing the lid over the package base such that the semiconductor die is enclosed, such that the glass layer of the lid is in contact with the plurality of leads, and such that at least a portion of each lead of the plurality of leads extends beyond the periphery of the lid; and sealing the lid and the package base together by subjecting the lid and package base to a thermal process involving a temperature in excess of the reflow temperature of the glass layer;

wherein during the step of sealing, a magnet is magnetically attached to those portions of each lead of the plurality of leads which extend beyond the periphery of the lid and beyond the periphery of the package base to maintain positions of the plurality of leads during the thermal process.

17. The method of claim 16 wherein the step of providing a package base comprises providing a ceramic package base and wherein the step of providing a lid comprises providing a ceramic lid.

18. The method of claim 16 wherein the step of sealing comprises subjecting the package base to a temperature of at least 350° C.

19. A method of assembling a semiconductor device comprising the steps of:

providing a ceramic base having a reflowable material on a surface thereof, the reflowable material having a reflow temperature;

providing a lead frame capable of being magnetized and having a plurality of leads, wherein the lead frame is positioned on the surface of the base;

placing a magnet in contact with the lead frame; and subjecting the base, the lead frame, and the magnet to a thermal process involving a temperature of at least the reflow temperature of the reflowable material, wherein during the step of subjecting, the magnet restricts movement of the plurality of leads, thereby maintaining accurate positions of the plurality of leads within the reflowable material.

20. A method of assembling a semiconductor device comprising the steps of:

providing a base having a glass reflowable material on a surface thereof, the reflowable material having a reflow temperature;

providing a lead frame capable of being magnetized and having a plurality of leads, wherein the lead frame is positioned on the surface of the base;

placing a magnet on the lead frame; and subjecting the base, the lead frame, and the magnet to a thermal process involving a temperature of at least the reflow temperature of the reflowable material, wherein during the step of subjecting, a magnetic field of the magnet restricts movement of the plurality of leads, thereby maintaining accurate positions of the plurality of leads within the reflowable material.

21. A method of assembling a semiconductor device comprising the steps of:

providing a base having a reflowable material on a surface thereof, the reflowable material having a reflow temperature;

placing a semiconductor substrate onto the base;

providing a lead frame capable of being magnetized and having a plurality of leads, wherein the lead frame is positioned on the surface of the base;

placing a magnet on the lead frame;

subjecting the base, the lead frame, and the magnet to a thermal process involving a temperature of at least the reflow temperature of the reflowable material, wherein during the step of subjecting, the magnet restricts movement of the plurality of leads, thereby maintaining accurate positions of the plurality of leads within the reflowable material; and removing the magnet from the lead frame after the step of subjecting.

22. A method of assembling a semiconductor device comprising the steps of:

providing a base having a reflowable material on a surface thereof, the reflowable material having a reflow temperature;

placing a semiconductor substrate onto the base;

providing a lead frame capable of being magnetized and having a plurality of leads, wherein the lead frame is positioned on the surface of the base;

placing a magnet on the lead frame;

subjecting the base, the lead frame, and the magnet to a thermal process involving a temperature of at least the reflow temperature of the reflowable material, and removing the magnet from the lead frame after the step of subjecting.

* * * * *